US007055013B2

(12) United States Patent
de Br bisson

(10) Patent No.: US 7,055,013 B2
(45) Date of Patent: May 30, 2006

(54) SPARE DATA SITE ALLOCATION

(75) Inventor: Cyrille de Br bisson, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 424 days.

(21) Appl. No.: 10/689,467

(22) Filed: Oct. 20, 2003

(65) Prior Publication Data

US 2005/0097406 A1 May 5, 2005

(51) Int. Cl.
*G06F 12/00* (2006.01)

(52) U.S. Cl. ........................ 711/170; 714/52; 714/710; 714/7; 369/47.14; 369/53.17

(58) Field of Classification Search ..................... None
See application file for complete search history.

(56) References Cited

U.S. PATENT DOCUMENTS

| | | | |
|---|---|---|---|
| 5,539,697 | A | 7/1996 | Kim et al. |
| 5,844,911 | A | 12/1998 | Schadegg et al. |
| 6,178,549 | B1 | 1/2001 | Lin et al. |
| 6,192,487 | B1 | 2/2001 | Douceur |
| 6,212,647 | B1 | 4/2001 | Sims, III et al. |
| 6,222,768 | B1 | 4/2001 | Hollmer et al. |
| 6,223,303 | B1 | 4/2001 | Billings et al. |
| 6,256,756 | B1 | 7/2001 | Faulk, Jr. |
| 6,266,677 | B1 | 7/2001 | Rodgers et al. |
| 6,266,791 | B1 | 7/2001 | Taugher et al. |
| 6,396,741 | B1 | 5/2002 | Bloom et al. |
| 6,427,186 | B1 | 7/2002 | Lin et al. |

*Primary Examiner*—Kevin Verbrugge
*Assistant Examiner*—Mehdi Namazi

(57) ABSTRACT

A method of allocating data sites of a storage device based on quality of the data sites, according to a particular embodiment of the invention, includes determining the quality of the data sites of the storage device by determining attribute information for the data series, and allocating certain of the data sites as spare data sites, based on their quality, for use in accommodating one or more defects in the storage device.

30 Claims, 6 Drawing Sheets

140

142 | 144

| SECTOR NUMBER | QUALITY VALUE |
|---|---|
| 1001 | 3 |
| 1002 | 3 |
| 1003 | 6 |
| 1004 | 7 |
| 1005 | 6 |
| 1006 | 5 |
| 1007 | 2 |
| 1008 | 2 |
| 1009 | 1 |
| 1010 | 2 |
| 1011 | 3 |
| 1012 | 9 |
| 1013 | 10 |
| ⋮ | ⋮ |
| n | 7 |

Fig. 10

SPARE DATA SITE ALLOCATION

BACKGROUND OF THE INVENTION

Many short-term and long-term storage devices have bad sectors or otherwise unusable areas. MRAM (magnetic random access memory), flash memory, atomic resolution storage (ARS) devices, and NROM (nitride read-only memory), for example, often include such defects. Typical bulk storage media, such as magnetic and optical disks, for example, also often include defects, such as inconsistencies in magnetic or optical coatings or other surface anomalies. In all cases, such unusable areas make portions of such media or other storage devices unsuitable for data storage. Nevertheless, it is desirable to use such media or devices for storage even though they contain defects. The defect areas are generally relatively small compared to the total storage area, and such defects may develop or first be detected only after normal use of the media or device has begun.

MRAM is a non-volatile memory usable for short-term and long-term data storage. MRAM is generally considered to have lower power consumption than short-term memory such as DRAM, SRAM and flash memory, and generally can perform read and write operations much faster (by orders of magnitude) than conventional long-term storage devices such as hard drives. In addition, MRAM is more compact and consumes less power than hard drives. MRAM is also usable for embedded applications such as extremely fast processors and network appliances. Use of MRAM thus provides various advantages in certain situations and environments.

In the case of bulk storage media, traditional schemes for defects management have relied on using a portion of the media as a defect management area in order to present a media that, although including defective areas, appears as if it were defect-free. Accordingly, upon a manufacturer's formatting of the media for subsequent use in data storage, an analysis of the storage areas occurs and defective areas are marked as unusable. A list of the defective areas is stored on the media. A defect management system reads the list from the media and uses it to map defective areas to spare areas on the media. In order to provide media that includes a particular amount of available user storage area, logical addresses of the user data areas are "slipped" into the defect management area so as to omit the physical addresses of the defective areas and, thus, present seemingly defect-free logical media.

As defective areas may develop or be discovered during actual use of bulk storage media, there have been methods of providing redirection for or replacement of such defective areas to predefined available spare areas. Defective areas discovered after bulk storage media is formatted, for example, typically are called "grown" defects. Systems operate to remap or redirect the logical address associated with an area determined to be defective to the logical address of the predefined spare area. Therefore, a manufacturer's initial formatting of the media can include establishing predefined user data areas and corresponding predefined spare areas for redirection or remapping of grown defects. For example, with magneto-optical (MO) disks, a MO drive recognizes the particular media and uses both the predetermined user data areas and predetermined spare areas (defect redirection or remapping areas). Such spare areas have been interspersed with the user data areas throughout the media at various intervals, e.g. the first or last "n" sectors of a track, thus establishing zones within the media wherein an amount of user data area and its corresponding spare area are established. Defect management tables have been provided to allow the drive to properly read and write user data within these zones without encountering a defective area. Such management tables store a list of used spare areas and are used to determine spare areas available for remapping. Defective areas are mapped out by reassigning their logical addresses to the predefined spare areas.

With "linear replacement" defect mapping, a defective sector is simply mapped to a predefined spare sector. Access times for bulk media with linear replacement mapping however, can increase undesirably. To reduce the access latency of linear replacement mapping, "sector slipping" is also used. With sector slipping, the assignment of a logical sector number to a physical sector number skips over the defective sector, and all of the logical sector numbers are "slipped" by one. Sector slipping generally is not considered to lend itself well to use with grown defects, because of the large amount of remapping that must occur.

Spare areas typically are disposed at predetermined locations or intervals in the media. Such locations or intervals typically are chosen "blindly", based on the physical makeup or structure of the storage device, i.e. regardless of their relative likelihood of failure. If a storage device is relatively free of defects, therefore, perfectly usable spare areas of the storage device may never be used and thus may be "wasted." If certain sectors allocated for user data are of questionable quality, on the other hand, a large number of grown defects may arise, increasing access time and potentially causing other problems.

SUMMARY OF THE INVENTION

A method of allocating data sites of a storage device based on quality of the data sites, according to a particular embodiment of the invention, includes determining the quality of the data sites of the storage device by determining attribute information for the data series, and allocating certain of the data sites as spare data sites, based on their quality, for use in accommodating one or more defects in the storage device.

BRIEF DESCRIPTION OF THE DRAWINGS

Embodiments of the invention are better understood with reference to the following drawings. The elements of the drawings are not necessarily to scale relative to each other. Like reference numerals designate corresponding similar elements.

FIG. 10 shows a quality table according to an embodiment of the invention.

DETAILED DESCRIPTION

Embodiments of the invention apply to a wide variety of short-term and long-term storage devices and media (collectively herein, "devices", for ease of reference). MRAM, flash memory, ARS devices, NROM, hard drives, bulk media, and other storage devices are among the possibilities for use according to embodiments of the invention. Although particular embodiments of the invention are described herein with respect to specific ones of these devices, such as MRAM, such embodiments are not necessarily limited to use with the specific devices described.

As mentioned above, many short-term and long-term storage devices have bad sectors or other defective data sites (collectively herein, "sectors", for ease of reference). It is desirable, according to embodiments of the invention, for firmware to hide the bad sectors from an associated host computer, processing device or other device. Accordingly, sectors addressed by the host (logical sectors) are assigned only to good sectors on the media or other device (physical sectors), instead of to bad physical sectors. One way to perform this association is to associate a logical sector "n" with the "nth" good physical sector. A table lookup associates the good physical sector numbers with the logical sector numbers.

With sparing association scheme 10 (FIG. 1) according to an embodiment of the invention, data storage takes as input one of the logical sectors 12, 14, etc. represented in row 15, along with associated data to be stored. The logical sectors of row 15 are associated with correct physical sectors 16, 18, etc. of row 20, advantageously in a time-effective and efficient manner. The associated data then is stored in (or read from) the correct physical sector. Bad sectors, represented at e.g. 22 and 24 of row 25, are avoided. One or more tables, lists, or other data structures or arrangements associated with scheme 10 are stored on the media, memory or other device with which scheme 10 is used, according to embodiments of the invention. Scheme 10, as stored, provides the physical sector associated with a given logical sector.

Embodiments of the invention operate to remap or redirect the logical address associated with areas determined to be defective to the logical addresses of spare areas. The locations of the spare areas are not necessarily predefined, according to embodiments of the invention, but are determined based on their physical properties and/or on thresholds or tolerances chosen by a user of the associated storage device or system.

Figure 2:
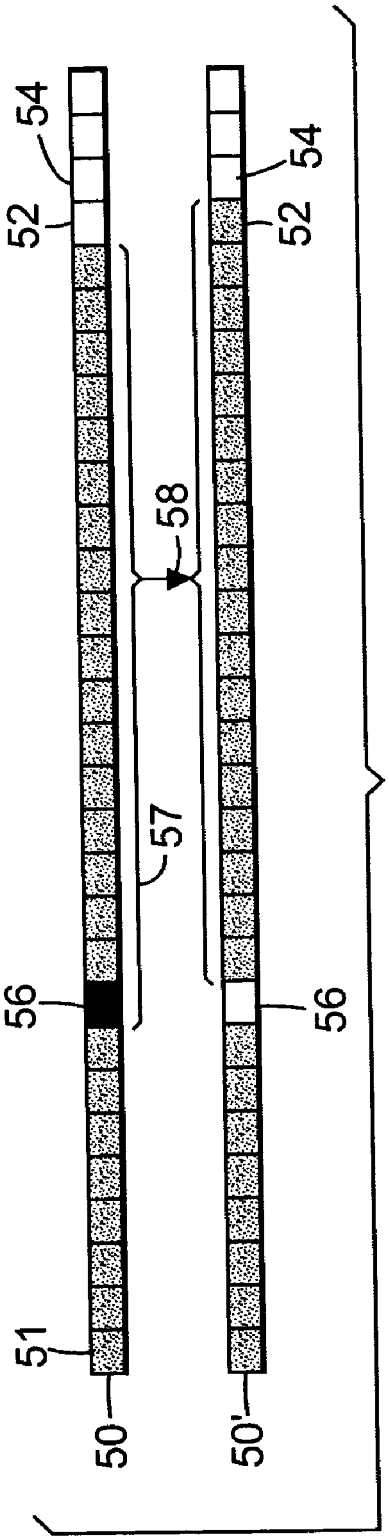
FIGS. 2–3 show remapping of storage devices using spare data sites, according to embodiments of the invention.
Figure 3:
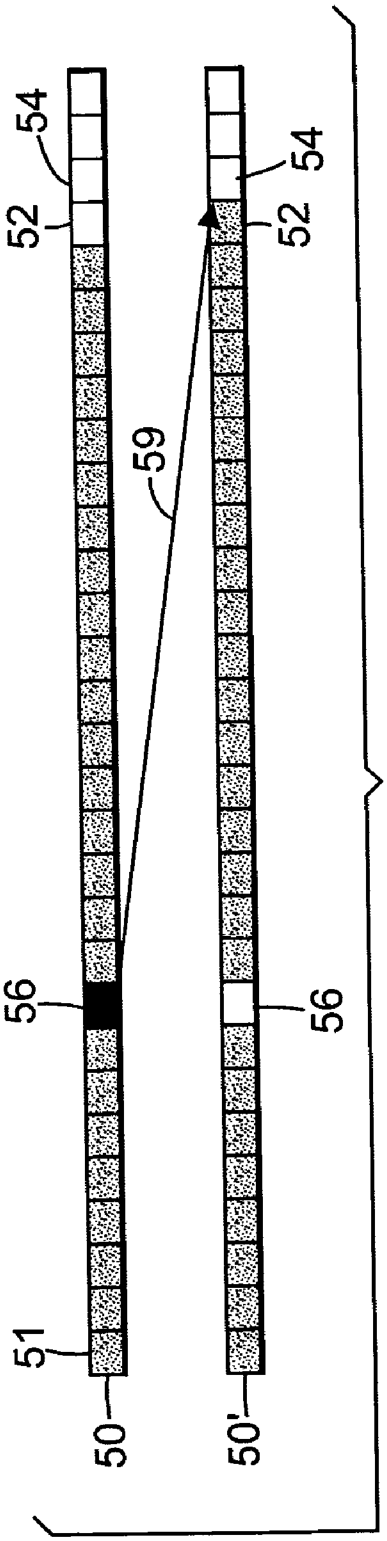

Storage device 50 in FIGS. 2–3, for example, includes data sites or sectors 51. Among sectors 51 are spare sectors 52, 54, etc., the locations of which are determined in a manner to be described. For purposes of illustration, the spare sectors 52, 54, etc. of FIGS. 2–3 are grouped at the end of device 50, and device 50 is arranged linearly and has a small number of illustrated sectors. It should be understood, however, that other devices are contemplated, as referenced above, and that spare sectors according to embodiments of the invention optionally are disposed at any location of device 50 and optionally are grouped together, disposed individually in an ungrouped fashion, or both grouped and ungrouped.

Sector 56 is a bad sector, representing a grown defect or other defect, for example. In the FIG. 2 embodiment, discovery of bad sector 56 causes set 57 of sectors to be remapped, as indicated by arrow 58. Because of the distance between bad sector 56 and first available spare 52, set 57 to be remapped includes 18 sectors. After remapping, as illustrated at 50' in FIG. 2, bad sector 56 is left unused, and spare 52 is used instead. FIG. 2 represents a "shift-based" process, in which the data in the bad sector and all the sectors afterwards are copied one block to the right, and the original slip sparing process is still used. In FIG. 3, discovery of bad sector 56 causes just that sector to be remapped, as illustrated by arrow 59. After remapping, as illustrated at 50', bad sector 56 is left unused, and spare 52 is used instead. FIG. 3 represents a "reallocation-based" process, in which just the bad data is relocated to the spare sectors. Defects on storage device 50 according to embodiments of the invention optionally comprise more than one or more than one contiguous sector, and/or one or more than one non-contiguous sector.

Devices 50 of FIGS. 2–3 have sectors that are physically or conceptually laid out "linearly," as with MRAM and other types of memory devices according to embodiments of the invention. As mentioned above, aspects of sector assignment according to embodiments of the invention also apply to a wide variety of other long-term and short-term storage devices, including without limitation flash memory, atomic resolution storage (ARS) devices, hard drives, and bulk storage media such as magnetic and optical disks. Devices 50 are intended to represent all the various storage devices that are usable according to embodiments of the invention.

Figure 4:
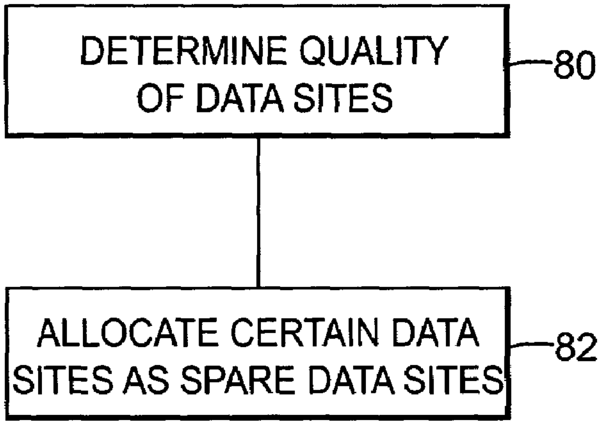
FIG. 4 is a flow diagram showing a method according to an embodiment of the invention.

FIG. 4 illustrates a method of allocating data sites 51 of storage device 50, according to an embodiment of the invention. The method includes determining, at 80, the quality of data sites 51 of storage device 50. At 82, the method further includes allocating certain of data sites 51 as spare data sites 52, 54, etc. The allocation is based on the quality of the data sites 51 determined at 80, and is for use e.g. in accommodating one or more defects 56 in storage device 50, for example during remapping as described with reference to FIGS. 2–3 or according to another remapping process. It should be understood that not every single data site 51 of storage device 50 is necessarily evaluated or allocated, according to embodiments of the invention, although optionally they all are. Embodiments of the invention build and/or store a sparing table based on allocation 82.

Figure 5:
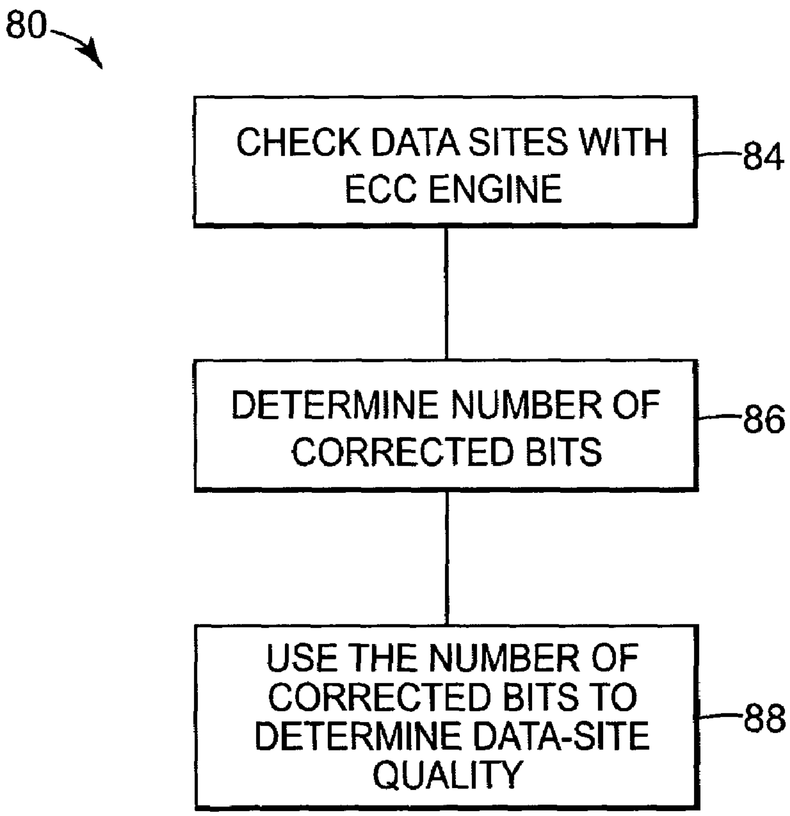
FIG. 5 is a flow diagram showing data-site quality determination according to an embodiment of the invention.

As shown in FIG. 5, one of the embodiments for carrying out determination 80 includes, at 84, checking data sites 51 with an error correction code (ECC) engine. An ECC engine or protocol detects single-bit and/or multi-bit errors and corrects errors on the fly, encoding information in a block of bits with detail sufficient to permit single-bit error recovery in the protected data. Chipsets supporting ECC generally are able to report such error correction to the operating system or other associated application. Embodiments of the invention use such reporting or other features of the ECC engine to determine, at 86, the number of bits corrected by the ECC engine for each respective data site 51 being checked. At 88, the number of bits corrected by the ECC engine for a particular data site 51 is used to determine the quality of that data site. Allocation 82 (FIG. 4) then includes allocating as spare data sites 52, 54, etc. those data sites 51 having a relatively high number of corrected bits, and/or allocating as non-spare data sites those data sites having a relatively low number of corrected bits.

Figure 6:
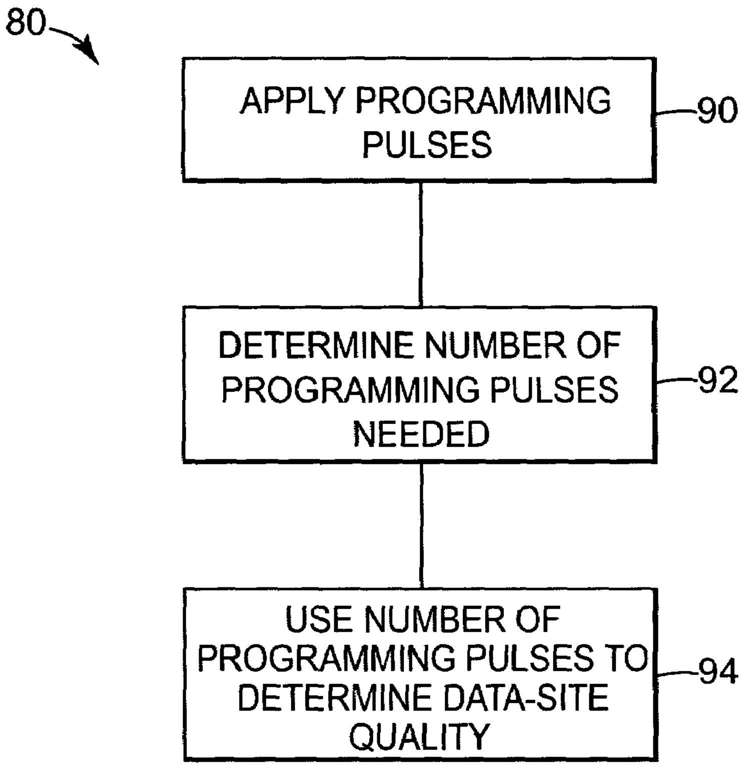
FIG. 6 is a flow diagram showing data-site quality determination according to an embodiment of the invention.

FIG. 6 illustrates another embodiment for carrying out determination 80 of FIG. 4. The determination includes, at 90, applying programming pulses to program data sites 51. In the case where storage device 50 comprises NROM, for example, each data site 51 optionally is an NROM cell bit programmed e.g. by electron injection. By exchanging the roles of the source and drain terminals, reading is performed in the opposite direction compared to programming. At 92, the method comprises determining the number of programming pulses needed for each respective data site 51. At 94, the method uses the number of programming pulses for a particular data site 51 to determine the quality of that data site. Allocation 82 (FIG. 4) then includes allocating as spare data sites 52, 54, etc. those data sites 51 requiring a relatively high number of programming pulses, and/or allocating as non-spare data sites those data sites requiring a relatively low number of programming pulses. Pulse application according to embodiments of the invention is not necessarily limited to NROM storage devices 50.

Figure 7:
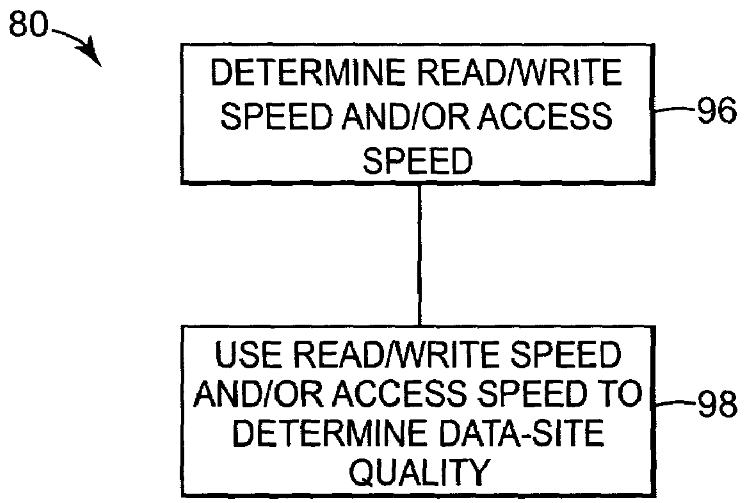
FIG. 7 is a flow diagram showing data-site quality determination according to an embodiment of the invention.

FIG. 7 illustrates another embodiment for carrying out determination 80 of FIG. 4. The determination includes, at 96, determining read/write speed and/or access speed for a particular data site 51. On some media, for example flash ROM, some sectors are slower to read/write than others. On other media, for example ARS devices, sectors located in the middle of the media provide slower access time, statistically speaking, than sectors located on the periphery. At 98, the method includes using the determined speed(s) for a particular data site 51 to determine the quality of that data site. Allocation 82 (FIG. 4) then includes allocating as spare data sites 52, 54, etc. those data sites 51 having a relatively low read/write speed or access speed, and allocating as non-spare data sites those data sites having a relatively high read/write speed or access speed.

Figure 1:
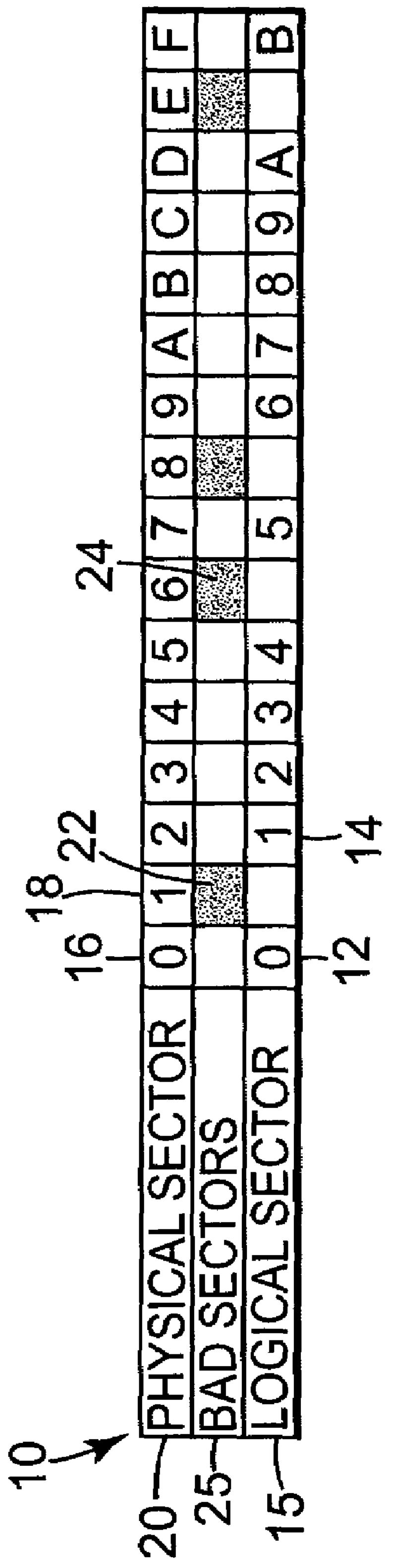
FIG. 1 shows an association scheme according to an embodiment of the invention.
Figure 8:
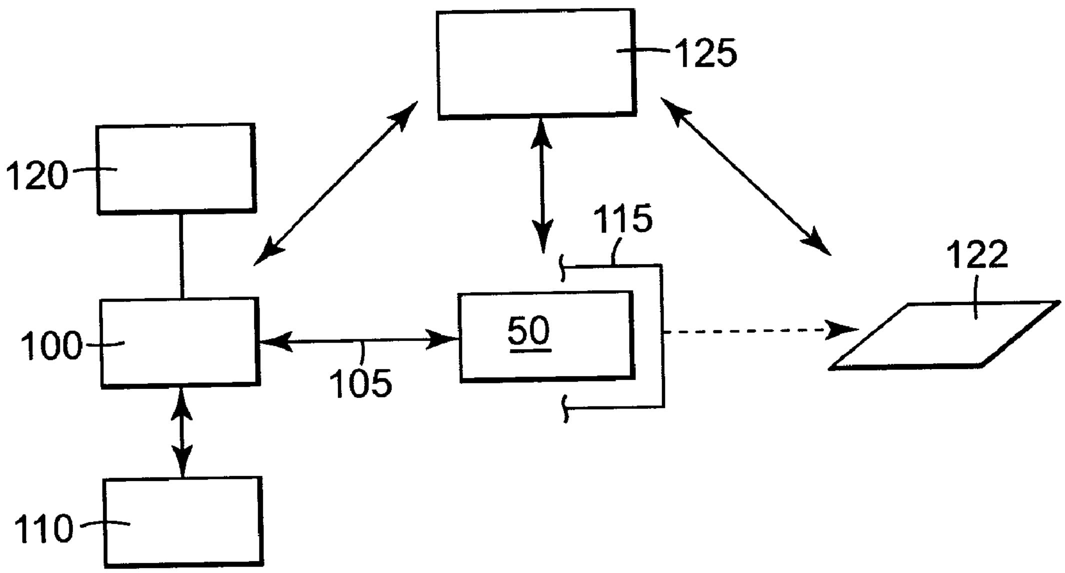
FIG. 8 is a schematic diagram showing hardware aspects according to an embodiment of the invention.

Turning to FIG. 8, controller 100 is operably coupled with device 50 as indicated by arrow 105. Device 50 represents any of the long-term storage, short-term storage, or other devices referenced previously herein, for example. At first boot-up, controller 100 tests or evaluates all or a desired number of sectors of device 50, e.g. in the manner described with respect to FIGS. 4–7, and creates one or more lookup or sparing tables or otherwise allocates spare sectors. An association scheme, such as scheme 10 of FIG. 1, is represented in such tables and includes physical sector entries and/or associated logical sector entries. Such tables and/or other data structures optionally are stored on device 50, on other media or in another location or device, such as in additional or supplemental memory 110, a mass media controller memory, etc.

The testing and storing performed using controller 100 optionally occur as part of a factory testing protocol, and/or to build statistical data for a first or other production series, for example. According to specific examples, controller 100 is a “testing” controller module that operably connects with each device 50 to test. Testing controller 100 optionally has a relatively large amount of RAM, allowing table-building quickly and efficiently. Device 50 and/or testing controller 100 optionally are included in a chip, card or package 115. Controller 100 optionally is an FPGA (Field Programmable Gate Array) or other form of hardware that does not have a fixed circuit, allowing a programmer to modify the circuit. Controller 100 and/or device 50 optionally are connected by a serial port or other connection to a test computer or other device 120, which contains additional memory and/or processing power. Controller 100 performs an initialization and test routine and provides statistics on package quality, for example, in addition to developing one or more of the above-described schemes/tables, according to embodiments of the invention. The tested package 115 optionally is mounted on a PCB or other platform 122, according to certain embodiments.

Figure 9:
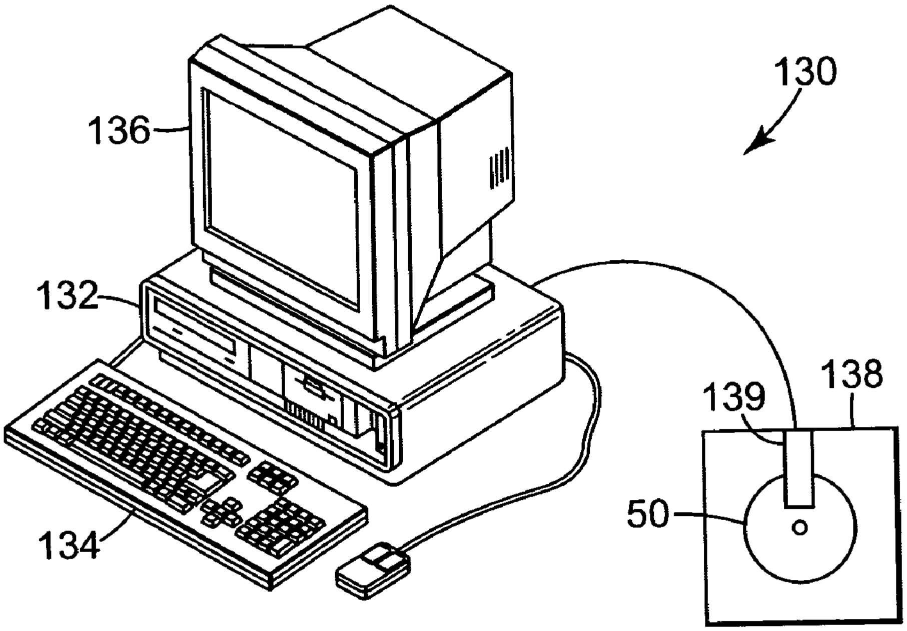
FIG. 9 is a perspective view of an electronic system according to an embodiment of the invention.

Device 50, controller 100, chip, card or package 115, and/or platform 122 are, optionally, physically and/or operably couplable with host 125. Host 125 according to embodiments of the invention includes one or more desktop or laptop computers, PDA’s, processors, digital cameras, cellular telephones, calculators, appliances, and/or a wide variety of other devices, for example. One specific host and storage device arrangement according to an embodiment of the invention is shown in FIG. 9. System 130 includes a processor-based system 132, in the form of a personal computer, acting as a host. System 132 has input device 134, e.g. a keyboard, and output device 136, e.g. a video display. System 130 according to this particular example includes bulk media drive unit 138 having storage device 50 disposed therein, e.g. in the case where device 50 is a hard drive. Drive unit 138 includes a head assembly 139 adapted to exchange information between device 50 and processor-based system 132. Other storage devices and/or bulk storage media, according to embodiments of the invention, are described previously herein, and can take a wide variety of form factors, such as chips or chip modules, compact flash-type cards, PC cards and other cards (optionally including one or more associated test or other controllers 120, as referenced herein), floppy disks, etc.

Thus, according to one embodiment of the invention, electronic storage system 130 includes host 132 and storage device 50 operably couplable to the host and having data sites 51 for storing data. At least one of storage device 50 and host 132 maintains information regarding an attribute or physical property of data sites 51, to determine which data sites are to be used as spare data sites in accommodating one or more defects in storage device 50. Storage device 50 optionally comprises MRAM, error correction code (ECC) protected media, NROM, or flash ROM, to name several examples. Data-site attribute or physical-property information optionally comprises one or more of ECC data, programming-pulse data, read/write-speed data, and access-time data, to name several examples. Storage device 50 maintains the attribute or physical-property information, according to one embodiment, and is adapted to report the information to the host.

Keyboard 134, display 136, and/or other user interface of system 130 are adapted to receive a threshold input from a user of system 130. System 130 uses both the threshold input and the attribute or physical-property information to determine which data sites are used as spare data sites. System 130 thus provides the user with the opportunity to choose e.g. a quality level vs. a capacity level of device 50. If the user wants higher-quality media, the user sets a relatively high threshold, and then only excellent sectors are allocated for user data. Lesser-quality sectors, however, which may be perfectly usable, then are unused. If the user wants higher-capacity media, the user sets a relatively lower threshold, and then lower-quality sectors are allocated for user data. The user then accepts the risk of lower-quality overall storage, but such storage is perfectly acceptable for use in many situations.

More specifically, as illustrated in FIG. 10, system 130 creates quality table 140. Table 140 includes sector numbers or indicators 142 and corresponding quality values 144. Quality values are assigned during determination 80 (FIG. 4), e.g. by controller 100, and optionally are based on one or more attributes or physical properties of data sites 51. According to the illustrated example, quality values 144 range from 1–10, although any quality range or quality indicator optionally is used. Additionally, table 144 optionally is a one-column table in which the $n^{th}$ entry of the table contains a quality value for the $n^{th}$ sector of the storage device. Allocation 82 comprises comparing quality value 144 for each data site 51 to the threshold value input by the user, to determine whether each respective data site 51 is a spare data site 52, 54, etc. or a non-spare data site. Alternatively, allocation 82 optionally assigns as spares only a certain fraction of data sites 51, e.g. the lowest X% of data sites in terms of quality. Allocation 82 also optionally includes reallocation of certain non-spare data sites as spare data sites or vice versa, depending e.g. on the threshold value chosen. Thus, storage device 50 is operably couplable to host 125 or 132 and maintains attribute information for data sites 51, e.g. physical-property information, such that one or more of the spare data sites 52, 54, etc. are reallocable as non-spare data sites in view of threshold information received from host 125/132. The attribute information is based on data-site quality information, e.g. at least one of error correction code data, programming-pulse data, read/write speed data, and access-time data, and optionally comprises quality table 140. Testing controller 100 is operably connectable to storage device 50 for determining the attribute information.

Embodiments of the invention also include one or more computer-readable media having stored thereon a computer program that, when executed by a processor, causes data-site allocation and/or the other features and capabilities described herein.

Embodiments of the invention provide a number of advantages. Better-quality sectors optionally are used for user data, and lesser-quality sectors are reserved for spares. Such allocation increases the chance that spares will not have to be used, thereby reducing the complexity of the system and improving overall quality and speed. Fastest sectors optionally are used for most-accessed data, allowing delivery of a faster overall product. Embodiments of the invention also present the user with the option to choose between increased quality of storage vs. increased capacity of the device.

What is claimed is:

1. A method of allocating data sites of a storage device based on quality of the data sites, the method comprising:

determining the quality of the data sites of the storage device by determining attribute information for the data sites; and allocating certain of the data sites as spare data sites, based on their quality, for use in accommodating one or more defects in the storage device.

2. The method of claim 1, wherein the determining comprises:

checking the data sites utilizing, at least in part, an error correction code (ECC);

determining the number of bits corrected utilizing, at least in part, the ECC for each respective data site; and using the number of corrected bits for a particular data site to determine the quality of that data site.

3. The method of claim 2, wherein the allocating comprises:

allocating as spare data sites those data sites having a relatively high number of corrected bits; and allocating as non-spare data sites those data sites having a relatively low number of corrected bits.

4. The method of claim 1, wherein the determining comprises:

applying programming pulses to program the data sites;

determining the number of programming pulses needed for each respective data site; and using the number of programming pulses for a particular data site to determine the quality of that data site.

5. The method of claim 4, wherein the allocating comprises:

allocating as spare data sites those data sites requiring a relatively high number of programming pulses; and allocating as non-spare data sites those data sites requiring a relatively low number of programming pulses.

6. The method of claim 4, wherein the storage device is an NROM device; further wherein the applying comprises applying programming pulses to program data sites of the NROM device.

7. The method of claim 1, wherein the determining comprises:

determining read/write speeds associated with the data sites; and using the read/write speed for a particular data site to determine the quality of that data site.

8. The method of claim 7, wherein the allocating comprises:

allocating as spare data sites those data sites having a relatively low read/write speed; and allocating as non-spare data sites those data sites having a relatively high read/write speed.

9. The method of claim 1, wherein the determining comprises:

determining access speeds associated with the data sites; and using the access speed for a particular data site to determine the quality of that data site.

10. The method of claim 9, wherein the allocating comprises:

allocating as spare data sites those data sites having a relatively low access speed; and allocating as non-spare data sites those data sites having a relatively high access speed.

11. The method of claim 1, further comprising building a sparing table based on the allocating.

12. The method of claim 11, in combination with remapping data sites of the storage device, using the sparing table, to accommodate the one or more defects in the storage device.

13. The method of claim 1, further comprising assigning a quality value to each data site, wherein the allocating comprises comparing the quality value for each data site to a threshold value to determine whether the respective data site is allocated as a spare data site.

14. An electronic system, comprising:

a host; and a storage device operably couplable to the host and having data sites for storing data;

wherein at least one of the storage device and the host maintains information regarding a physical property of the data sites, to determine which data sites are to be used as spare data sites in accommodating one or more defects in the storage device.

15. The system of claim 14, wherein the storage device comprises magnetic random access memory (MRAM).

16. The system of claim 14, wherein the storage device comprises error correction code (ECC) protected media; further wherein the physical-property information comprises ECC data.

17. The system of claim 14, wherein the storage device comprises nitride read-only memory (NROM); further wherein the physical-property information comprises programming pulse data.

18. The system of claim 14, wherein the storage device comprises flash ROM; further wherein the physical-property information comprises read/write speed data.

19. The system of claim 14, further comprising a user interface adapted to receive a threshold input from a user of the system, wherein the system compares the threshold input and the physical-property information to determine which data sites are to be used as spare data sites.

20. The system of claim 14, wherein the storage device maintains the physical-property information and is adapted to report the information to the host.

21. The system of claim 14, wherein the physical-property information comprises a data-site quality table.

22. A storage device operably couplable to a host and having data sites for storing data, the data sites comprising spare data sites for accommodating one or more defects in the storage device, wherein the storage device maintains attribute information for the data sites such that at least one spare data site is reallocable as a non-spare data site in view of threshold information received from the host.

23. The storage device of claim 22, wherein the attribute information is based on data-site quality information.

24. The storage device of claim 22, wherein the attribute information comprises at least one of error correction code data, programming-pulse data, read/write speed data, and access-time data.

25. The storage device of claim 22, in combination with a testing controller operably connectable to the storage device for determining the attribute information.

26. The storage device of claim 22, wherein the attribute information comprise a quality table.

27. An electronic system, comprising:

means for determining the quality of data sites of a storage device; and means for allocating certain of the data sites as spare data sites, based on their quality, for use in accommodating one or more defects in the storage device.

28. One or more computer-readable media having stored thereon a computer program that, when executed by a processor, causes data-site allocation according to the following method:

determining the quality of the data sites of the storage device by determining attribute information for the data sites; and allocating certain of the data sites as spare data sites, based on their quality, for use in accommodating one or more defects in the storage device.

29. Media according to claim 28, wherein the determining comprises:

checking the data sites utilizing, at least in part, an error correction code (ECC);

determining the number of bits corrected utilizing, at least in part, the ECC for each respective data site; and using the number of corrected bits for a particular data site to determine the quality of that data site.

30. Media according to claim 28, wherein the determining comprises:

determining read/write speeds associated with the data sites; and using the read/write speed for a particular data site to determine the quality of that data site.

* * * * *